US005809646A

United States Patent [19]

Reinecke et al.

[11] Patent Number: 5,809,646

[45] Date of Patent: Sep. 22, 1998

[54] METHOD OF MAKING A NOZZLE PLATE FOR A LIQUID JET PRINT HEAD

[75] Inventors: Holger Reinecke; Nezih Unal, both of Dortmund; Ralf-Peter Peters, Bergisch-Gladbach; Frank Bartels, Hattingen; Friedolin Franz Noker, Karlsruhe, all of Germany

[73] Assignee: MicroParts GmbH, Dortmund, Germany

[21] Appl. No.: 715,096

[22] Filed: Sep. 17, 1996

Related U.S. Application Data

[62] Division of Ser. No. 297,780, Aug. 30, 1994, Pat. No. 5,588,597.

[30] Foreign Application Priority Data

Sep. 3, 1993 [DE] Germany .......................... 43 29 728.5

[51] Int. Cl.[6] .............................. B41J 2/16; B22D 25/02; G03F 7/00

[52] U.S. Cl. ....................... 29/890.1; 29/527.3; 29/527.5; 29/DIG. 5; 216/27; 347/47; 430/326

[58] Field of Search ............................... 29/25.35, 527.2, 29/527.5, 890.1, 33 C, DIG. 5, DIG. 10; 216/27; 347/47; 427/329; 430/326

[56] References Cited

U.S. PATENT DOCUMENTS

| | | | |
|---|---|---|---|
| 3,777,344 | 12/1973 | Glass | 29/890.09 |
| 4,393,129 | 7/1983 | Glashauser et al. | 430/326 X |
| 4,493,137 | 1/1985 | Bader et al. | 29/25.35 |
| 4,745,670 | 5/1988 | Morris | 29/890.142 |
| 5,415,977 | 5/1995 | Wuensch et al. | 430/326 |
| 5,548,894 | 8/1996 | Muto | 29/890.1 |
| 5,560,837 | 10/1996 | Trueba | 29/890.1 X |
| 5,588,597 | 12/1996 | Reinecke et al. | 347/47 X |

*Primary Examiner*—Peter Vo
*Attorney, Agent, or Firm*—Oblon, Spivak, McClelland, Maier & Neustadt, P.C.

[57] ABSTRACT

A nozzle plate contains nozzles, liquid chambers and connection channels between liquid chambers and supply containers for the liquid. All the function regions are produced integrally as a microstructure body by casting from one or more microstructured mold inserts. The smallest implementable spacing of the nozzles from one another can be considerably smaller than in the previously known plates, which allows increased printing density.

4 Claims, 3 Drawing Sheets

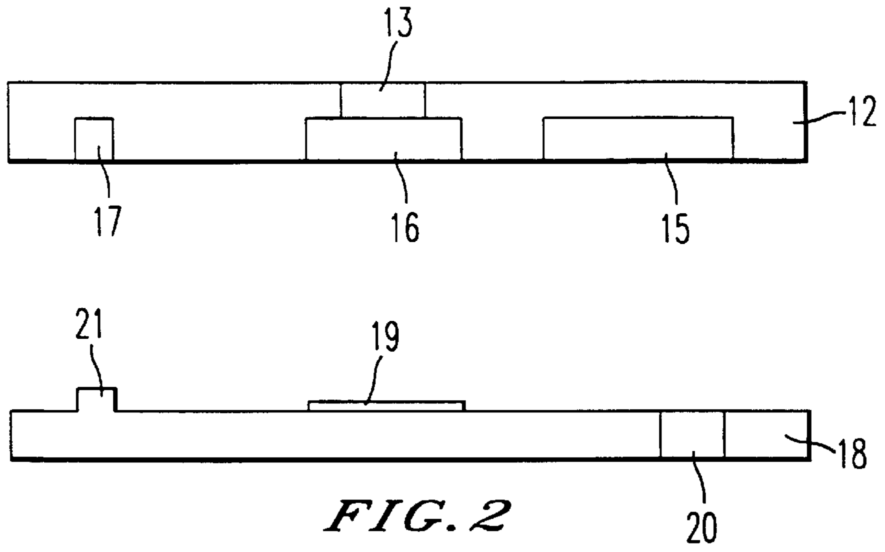
FIG. 2
FIG. 3
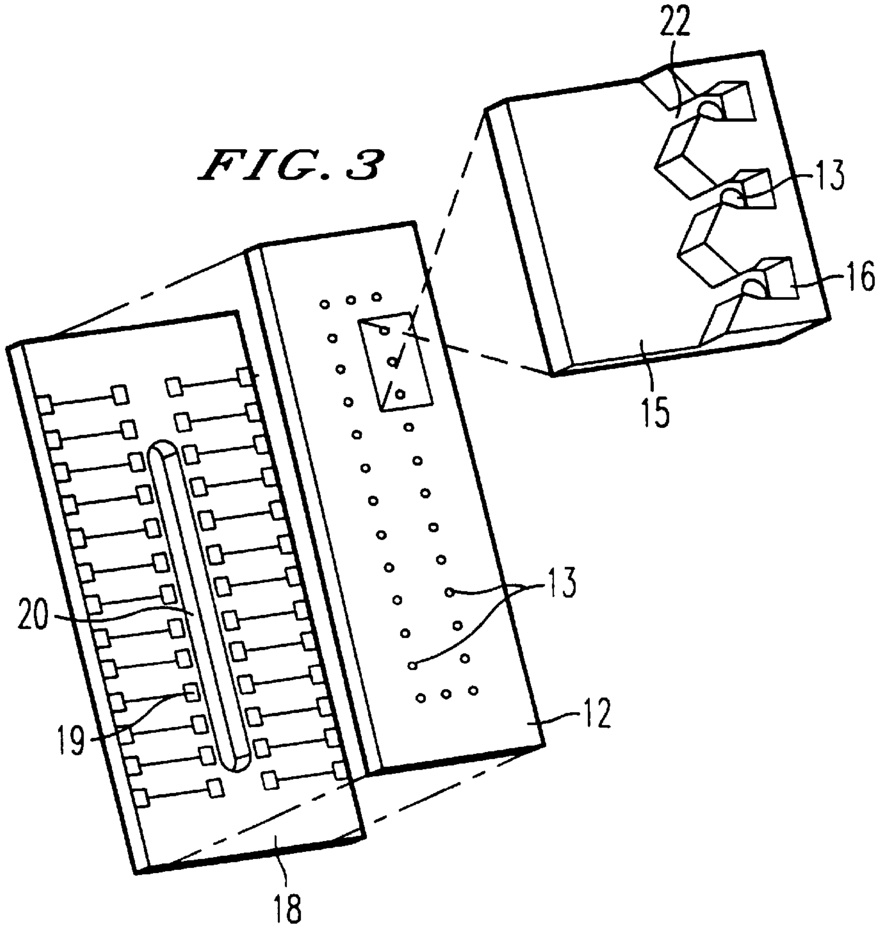

METHOD OF MAKING A NOZZLE PLATE FOR A LIQUID JET PRINT HEAD

This is a Division, of application Ser. No. 08/297,780 filed on Aug. 30, 1994 now U.S. Pat. No. 5,588,597.

BACKGROUND OF THE INVENTION

1. Field of the Invention

The invention relates to a nozzle plate for print heads which are used in ink jet and colored-liquid jet printers and to a method for its production. The purpose of the invention is to produce such nozzle plates and the print heads fitted therewith more economically and to improve their function in respect of printing speed and resolution.

2. Description of the Related Art

Nozzle plates for ink and colored-liquid jet print heads are known (Hewlett-Packard Journal, August 1988, pages 28 to 31) (EP-495,663; EP-500,068); such nozzle plates contain 12 to about 100 nozzles with a hole diameter of down to 20 μm. Ahead of each nozzle there lies an ink chamber which communicates with an ink container via specially shaped channels. A device for ejecting droplets having a volume of 1 to 1000 picoliters communicates with each nozzle. The print head is frequently obtained by joining together the ink container with, in general, three plates, one plate being a thin-layer structure, the next plate being a lithographically produced plastic structure with a feed channel and ink chamber (channel plate), and the third plate containing the nozzles (nozzle plate). Both the production of the nozzle plate and of the channel plate and the joining together of the plates to form the print head require considerable effort and great precision.

The nozzle plate is produced, for example, by laser treatment of plastic parts. In other methods, a conductive base plate is used, which is provided at particular places with a non-conducting plastic layer. The non-conducting places are circular; their spacing corresponds to the intended spacing of the nozzles in the nozzle plate. Metal is deposited electrolytically on the base plate. This metal layer is thicker than the non-conducting layer, and the electrolytically deposited metal inevitably grows over the edge of the nonconducting places onto the non-conducting layer. In this way, smaller nozzle diameters are implemented than corresponds to the dimensions of the lithographically produced, non-conducting places of the plastic layer. In order to maintain the nozzle cross-section and its fluctuation from nozzle to nozzle within the prescribed tolerances, complex manufacturing and measuring methods have to be applied. In the latter production method described, the spacing between holes is inevitably greater than the thickness of the plate to be produced. Since the plate must have a minimum thickness for reasons of stability, the smallest spacing possible between holes and thus also the printing density are limited.

According to EP-495,663, the channel structures and the nozzle carrier are produced by casting. The nozzles are bored individually in each case by means of a laser beam. The channel structures and nozzles are produced in two steps according to completely different methods. Furthermore, finishing is required. This method is also very complex.

SUMMARY OF THE INVENTION

It is an object of the invention to produce nozzle plates and channel plates with which liquid jet print heads can be fitted together in a simpler manner, possibly with greater precision.

According to the invention, the above and other objects are achieved by a nozzle plate which contains nozzles, liquid chambers, function regions of the connection channels between liquid chambers and supply containers for the liquid as well as adjusting elements if appropriate, all the function regions being produced as integral microstructure bodies by casting from a mold insert.

Furthermore, filters and fluidic structures may belong to the function regions of the nozzle plate to enhance the printing quality.

The microstructured mold insert of metal which contains all the function regions of the nozzle plate in a complementary structure is produced, for example, by lithography, preferably gravure lithography with radiographic rays, and electroforming. Using lithographic methods, non-round or non-square nozzle outlet apertures can also be implemented. For this purpose, a metal base plate is used, which is covered with a first layer of suitable thickness of a (positive or negative) radiographic resist. This layer is irradiated through a first mask which bears an absorber structure for radiographic rays, as a result of which the solubility of the first resist layer at the places irradiated is changed. During development of the irradiated, first resist layer, the regions which have remained or become soluble are removed.

Subsequently, a second layer of a radiographic resist is generally applied in a suitable thickness, which layer is irradiated with radiographic rays through a second mask, said second mask bearing a different absorber structure from that of the first mask. After the development of the second resist layer, a metal is electrodeposited in the microstructure made of plastics (resist) located on the base plate, all the cavities in the microstructure being completely filled with metal. Subsequently, further metal is deposited, as a result of which the entire microstructure is covered.

The microstructure of metal is separated from the microstructure made of plastics located on the base plate, the microstructured mold insert of metal being obtained, which contains all the function regions of the nozzle plate in a complementary structure.

By means of the mold insert, the microstructured nozzle plate made of plastics is produced, for example by injection molding, as an integral microstructure body with all the function regions in a single step.

If two mold inserts structured differently are inserted in the injection molding die, an integral nozzle plate can be produced, which contains function elements on both sides. A nozzle plate which can be produced by means of this method and, by structuring nozzle channels on two sides of the plate, the printing density can be doubled and/or two different colors can be used.

In addition to lithography, methods of laser treatment, precision mechanics and etching techniques as well as combinations of these methods can also be used to produce the mold insert. The cross-sectional shape of the nozzles can thus also be changed; for example, nozzles can be produced with a cross-section which decreases gradually in the flow direction.

This can be achieved, for example, by

- irradiating the resist layers at an angle to the perpendicular line onto the surface, or by
- the multiple use of the lithographic method in a plurality of planes one above the other, in each case with a different mask geometry, or by
- a suitable variation of exposure and development parameters.

It is true that the production of the mold insert requires great precision and can be quite complex since, in this case, the arrangement of the function regions relative to one another is adjusted. However, it is worth this effort since it is only required in the production of the mold insert. The nozzle plates themselves are cost-effectively produced as replicas in large numbers and, without additional outlay, have virtually the same precision as the mold insert.

The nozzle plate made of plastics can be produced by injection molding, reaction molding or embossing by means of a metal mold insert. These methods allow cost effective mass production of nozzle plates. The nozzle plate of metal which contains all function regions as an integral microstructured body, can likewise be produced by the cost effective production of a microstructured insert which contains all the functional regions of the nozzle plate in the identical structure. For this purpose, the negative mold is converted in an electroforming process—in analogy to the process described in the production of the mold insert—into a metal structure with the desired nozzle holes and function elements.

Examples of suitable plastics are polysulphone, poly (ether sulphone), poly(methyl methacrylate), polycarbonate, poly(ether ether ketone) and liquid crystal polymers.

Suitable for producing a nozzle plate of metal are, for example, nickel or nickel/cobalt alloys or copper/tin/zinc alloys; such plates are inserted either directly or with a coating.

The present invention has the following advantages:

The nozzle plate having a plurality of function regions facilitates the production of the print head, especially because fewer single parts have to be assembled.

Even very complex structures of the nozzle plate can be produced cost-effectively in large numbers and with great precision by means of casting from the mold insert.

The method has a high structure resolution and allows great packing density of the function regions. Structures of a high aspect ratio and virtually any desired shape can be produced.

The nozzle plate permits a high printing speed and is particularly suitable for print heads having a plurality of colors.

The complex adjustment of the function regions relative to one another is only required during production of the mold insert.

The number of manufacturing steps and the range of parts are reduced, as a result of which productivity rises and, at the same time, the outlay for quality control is reduced.

By using non-round or non-square nozzle outlet apertures, controlled separation of the droplet and stabilization of the flight direction can be achieved.

The method is very flexible and allows nozzle plates structured very differently to be produced from various materials.

The function regions of a nozzle plate can be arranged in a compact manner.

The nozzle spacings can be less than 1/10 of the plate thickness.

BRIEF DESCRIPTION OF THE DRAWINGS

These and other objects, as well as advantageous features of the present invention, will become apparent by reading the description of the preferred embodiments according to the present invention with reference to the drawings, wherein:

FIG. 2 shows a nozzle plate made by the process of FIG. 1;

FIG. 3 shows the nozzle plate of FIG. 2 prior to assembly with a silicon plate.

DETAILED DESCRIPTION OF THE PREFERRED EMBODIMENTS

Figure 1A:
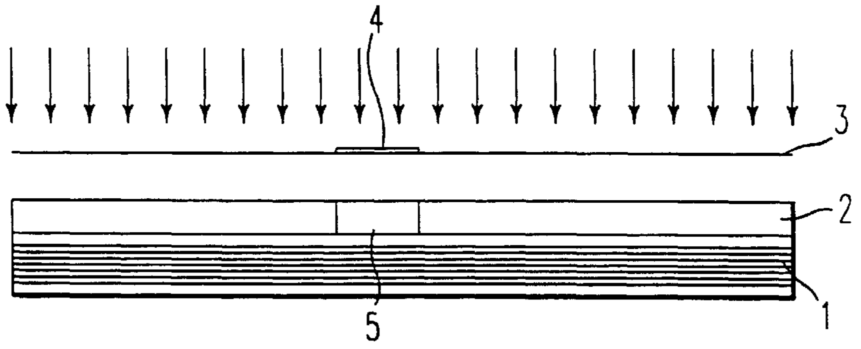
FIGS. 1(*a*) through 1(*e*) show the main steps for producing a mold insert by lithography and electroforming.
Figure 1B:
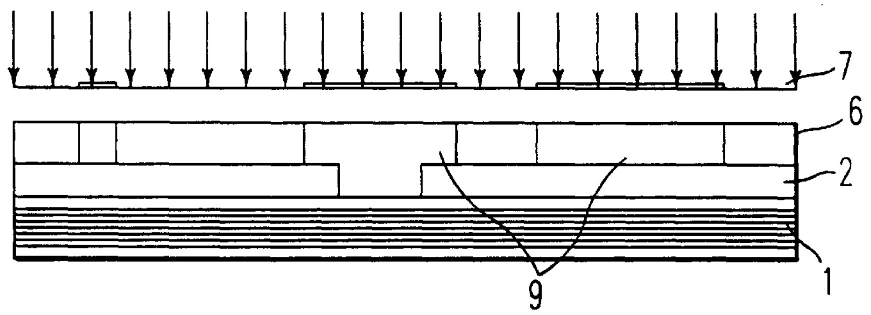
Figure 1C:
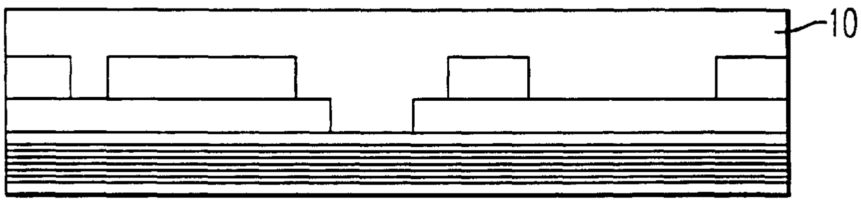
Figure 1D:
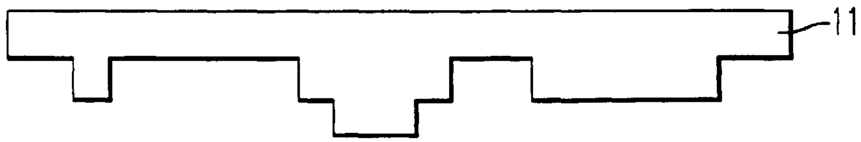
Figure 1E:
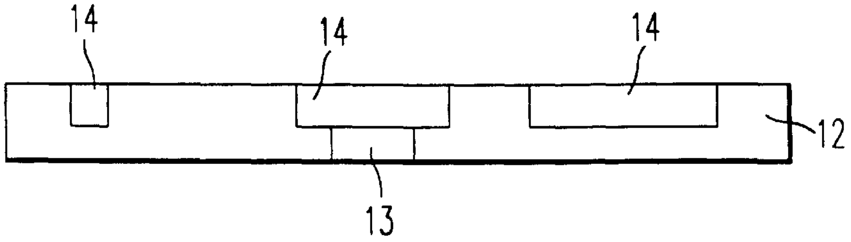

Preferred embodiments of the invention will now be described with reference to the accompanying figures.

On the metal base plate 1 there is the first resist layer 2 which is irradiated through the first mask 3 with parallel light FIG. 1(*a*)). The thickness of this resist layer corresponds to the thickness of the structure to be produced. The first mask bears the absorber structure 4 which shades the regions 5 of the first resist layer located below it.

After removal of the non-irradiated regions of the first resist layer 2, the second resist layer 6 is applied (FIG. 1(*b*)), which is irradiated through the second mask 7. The second mask bears the absorber structure 8 which shades the regions 9 of both resist layers located below it. After removal of the non-irradiated regions 9 of the second layer 6 and of the material which may have penetrated into the regions from which the first resist layer has already been removed, a structure is obtained which corresponds to the structure of the nozzle plate.

The regions from which the resist layers have been removed are filled by electrodepositing of metal (FIG. 1(*c*)), e.g., Ni, NiCo, Cu, and the entire region is covered with a metal layer 10. After separating the metal layer from the base plate and remaining resist material, the metal mold insert 11 is obtained (FIG. 1(*d*)), whose structure is complementary to the structure of the nozzle plate. By casting from the mold insert 11, the nozzle plate 12 made of plastics is produced (FIG. 1(*e*)), which contains the nozzles 13 as well as further function regions 14.

FIG. 2 shows, as an example, a nozzle plate 12 formed of a cast plate structure with a nozzle 13, liquid trough 15, liquid chamber 16 and a cutout 17 as an adjustment aid for attachment to the opposite plate 18. This plate 18 consists, for example, of silicon and bears, as a thin-layer structure, a heating element 19 which is located opposite each nozzle through which the liquid droplets are ejected. The plate 18 has a liquid inlet 20 and a peg 21 which fits into the cutout 17.

FIG. 3 illustrates a nozzle plate 12 in a view from above prior to assembly with the silicon plate 18. The silicon plate bears a plurality of heaters 19 with electrical leads, and the liquid inlet 20. The nozzles 13 are arranged in two rows and are illustrated on the top of the nozzle plate 12.

Furthermore, an enlarged extract of the underside of the nozzle plate 12 is illustrated. On this, a plurality of nozzles 13, the liquid trough 15 and the liquid chamber 16 belonging to each nozzle, as well as a plurality of liquid channels 22 which connect the liquid trough to a liquid chamber in each case, can be seen.

The nozzle plate 12 is connected to the silicon plate 18 by gluing, bonding or in another manner.

Figure 4:
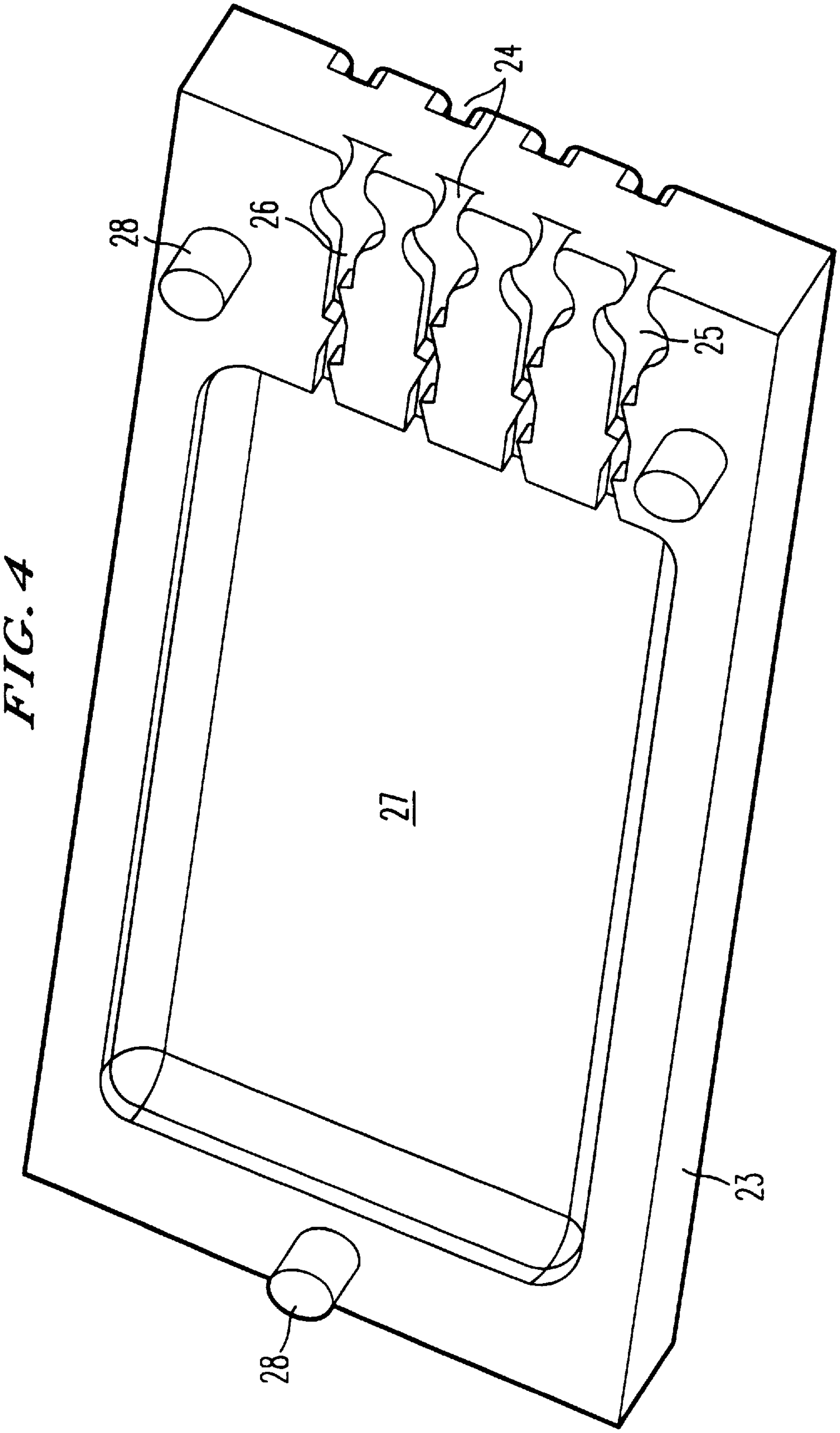
FIG. 4 shows a nozzle plate according to a second embodiment.

FIG. 4 shows an integral nozzle plate 23 according to another embodiment, which may be usable for a two color print head, prior to its assembly with two silicon plates (not illustrated); the latter bear a heating element for each nozzle as well as its electrical connections. Located upstream of each nozzle aperture 24 is a round liquid chamber 25 which is connected to the liquid trough 27 via the nozzle channel 26. The nozzle plate contains a row of nozzles on each side; the two rows of nozzles are offset relative to one another. If this nozzle plate is provided for a two color print head, it has a liquid trough on each side of the plate, the two liquid troughs not communicating with one another. Additionally, this nozzle plate bears, on each side, adjusting pegs 28 for precise assembly with the two silicon plates.

EXAMPLE 1

Method for producing a mold insert for a nozzle plate with an axial liquid jet.

To produce the mold insert, a 100 μm thick resist layer of poly (methyl methacrylate) (PMMA) is applied to a base plate made of copper (10 mm thick, about 100 mm wide and about 100 mm long). This layer is irradiated with synchrotron radiation through a first radiographic mask. The first mask is structured in a form matching the structure of the nozzle plate. By means of the radiographic radiation, the irradiated regions of the first resist layer become soluble. The regions irradiated through the first mask are removed using a solution of GG developer.

Subsequently, the regions from which the first resist layer has been removed are filled with nickel, and the entire plate is covered with a 50 μm thick resist layer of PMMA. This layer is irradiated with synchrotron radiation through a second radiographic mask. The second mask is structured in a form matching the structure of the channel plate and the structure of the first mask. By means of the radiographic radiation, the irradiated regions of the second resist layer become soluble down to a depth of about 65 μm due to targeted dose accumulation. The regions of the second resist layer irradiated through the second mask are removed using a solution of GG developer.

Nickel is electrodeposited in the regions from which the resist layer has been removed, and the entire plate is covered with a nickel layer about 8 mm thick, the nickel structure of the first plate serving as an electrical contact.

The base plate made of copper is cut off, and the remaining parts of both resist layers are removed using polyethylene glycol. The mold insert whose structure is complementary to the structure of the nozzle and channel plate is thus obtained.

EXAMPLE 2

Nozzle plate for a print head with an axially emerging liquid jet.

The nozzle plate produced by means of a mold insert according to Example 1 contains 108 nozzles, in 2 rows, with a diameter of 50 μm and a nozzle length of 100 μm. The liquid chamber is 50 μm deep and 70 μm wide below the nozzles. The liquid trough is likewise 50 μm deep. The narrowest place in the liquid channels is about 30 μm wide.

This integral nozzle plate is glued to a silicon plate which contains a heating element for each nozzle, its electrical connections and the liquid inlet. The adhesive used is a polyurethane adhesive.

EXAMPLE 3

Nozzle plate for a print head with a liquid jet emerging in the plane of the plate.

The integral nozzle plate produced by means of two mold inserts according to Example 1 contains a total of 216 nozzles on both sides. The nozzles on each side have a spacing of 84 μm. The two rows of nozzles are offset relative to one another by 42 μm. The dimensions of the nozzle channel at the narrowest place are 40 μm wide and 40 μm deep. The diameter of the liquid chamber located ahead of the nozzle is 60 μm, the wall thickness between the liquid chambers is 24 μm. The narrowest part of the liquid channel is 20 μm wide.

This integral nozzle plate is glued on both sides to a silicon plate which contains a heating element for each nozzle and its electrical connections. The adhesive used is a polyurethane adhesive.

For a single-color print head, there is a liquid inlet in the silicon plate on one side only and a liquid passage in the liquid trough of the nozzle plate.

For a two-color print head, an arrangement having in each case a liquid feed in each of the two silicon plates can be implemented; in this case, the opening in the liquid trough of the nozzle plate is not required.

Obviously, numerous modifications and variations of the present invention are possible in light of the above teachings. It is therefore to be understood that within the scope of the appended claims, the invention may be practiced otherwise than as specifically described herein.

We claim:

1. A method of making a nozzle plate having a plurality of functional regions for a liquid jet print head, comprising the steps of:

forming a metal mold insert, said mold insert having a microstructured configuration complementary to a nozzle plate to be produced; and casting a nozzle plate having at least one nozzle from the mold insert in one single production step, and said nozzle plate containing all functional regions within an integral microstructured body.

2. A method of making a nozzle plate having a plurality of functional regions for a liquid jet print head, comprising the steps of;

forming a metal mold insert, said mold insert having a microstructured configuration complementary to a nozzle plate to be produced; and casting a nozzle plate having at least one nozzle from the mold insert, wherein said forming step comprises a lithographic forming technique.

3. The method according to claim 2 including a step of assembling the nozzle plate with at least one further plate having electrical leads and a heating element for each said at least one nozzle.

4. The method according to claim 2 wherein said nozzle plate has at least one nozzle on two opposite sides thereof, including a step of assembling the nozzle plate with two further plates, each of said further plates being assembled to one of said opposite sides and having electrical leads and a heating element for said at least one nozzle on one of said two opposite sides.

* * * * *